United States Patent [19]
Ikeda et al.

[11] Patent Number: 5,481,558
[45] Date of Patent: Jan. 2, 1996

[54] LIGHT EMITTING DEVICE

[75] Inventors: Masao Ikeda; Toyoharu Ohata, both of Kanagawa, Japan

[73] Assignee: Sony Corporation, Tokyo, Japan

[21] Appl. No.: 261,150

[22] Filed: Jun. 14, 1994

[30] Foreign Application Priority Data

Jun. 15, 1993 [JP] Japan .................... 5-143910

[51] Int. Cl.$^6$ ...................... H01S 3/19
[52] U.S. Cl. .................... 372/45; 372/44; 372/46
[58] Field of Search .................. 372/44, 45, 46; 257/72

[56] References Cited

U.S. PATENT DOCUMENTS

| | | | |
|---|---|---|---|
| 5,202,285 | 4/1993 | Sugano et al. | 372/46 |
| 5,250,814 | 10/1993 | Morita | 372/45 |
| 5,291,507 | 3/1994 | Hasse et al. | 372/44 |
| 5,296,718 | 3/1994 | Fujita et al. | 372/45 |
| 5,371,756 | 12/1994 | Fujii | 372/45 |
| 5,373,521 | 12/1994 | Takahashi | 372/46 |
| 5,403,916 | 4/1995 | Watanabe et al. | 257/72 |

*Primary Examiner*—Rodney B. Bovernick
*Assistant Examiner*—Yisun Song
*Attorney, Agent, or Firm*—Hill, Steadman & Simpson

[57] ABSTRACT

According to the present invention, a p-type ZnSe or p-type ZnSSe buffer layer is formed on a p-type GaAs substrate through at least single layer made of AlGaInP-based material and a II/VI-compound laser structure is formed on the p-type ZnSe or p-type ZnSSe buffer layer. Further, an AlGaAs-based buffer layer is provided between the substrate and the AlGaInP-based buffer layer. Further, the AlGaAs-based buffer layer has a composition expressed as $Al_{0.5}Ga_{0.4}As$ and the AlGaInP-based buffer layer has a composition expressed as $Al_{0.5}In_{0.5}P$. Furthermore, a composition ratio x of Al in a buffer layer expressed as $Al_xGa_{1-x}As$ is modulated from 0 to 0.6 and a composition ratio y of Al in a buffer layer expressed as $(Al_yGa_{1-y})_{0.5}In_{0.5}P$ is modulated from 0 to 1. According to the present invention, an operation voltage of the II/VI-compound semiconductor laser can be reduced and the green or blue color semiconductor laser of low operation voltage can be obtained. This semiconductor laser can continuously be operated at room temperature and also operated with a long life span.

6 Claims, 8 Drawing Sheets

LIGHT EMITTING DEVICE

BACKGROUND OF THE INVENTION

The present invention relates to semiconductor lasers and, more particularly, is directed to a semiconductor laser in which a cladding layer and an active layer are formed of II/VI-compound semiconductors.

FIG. 1 of the accompanying drawings is a schematic enlarged cross-sectional view of an example of a II/VI-semiconductor laser having a relatively wide bandgap. As shown in FIG. 1, this semiconductor laser comprises an n-type GaAs substrate 1, a first cladding layer 3 made of an n-type II/VI-compound, an active layer 4 made of an intrinsic II/VI-compound, a second cladding layer 5 made of a p-type II/VI-compound, and a p-type contact layer 6 that are grown on the n-type GaAs substrate 1, in that order, by some suitable method, such as MOCVD (metal organic chemical vapor deposition) and MBE (molecular beam epitaxy). Further, a p-side electrode 7 is deposited on the p-type contact layer 6 and an n-side electrode 8 is deposited on the rear surface of the n-type GaAs substrate 1.

The first and second cladding layers 3 and 5 are made of ZnMgSSe, ZnSSe or a combination of ZnMgSSe, ZnSSe and ZnSe as the optical guide layer, for example. An n-type dopant might be Cl, Ca or the like, and a p-type dopant might be N, O or the like. The active layer 4 is formed of a single quantum well of ZnSe and ZnCdSe or multiplex distortion quantum well of ZnSe and ZnCdSe. Further, the p-type contact layer 6 is formed of p-ZnSe in which N is doped such that $N_A - N_D$ ($N_A$ is an acceptor concentration and $N_D$ is a donor concentration) becomes approximately $1 \times 10^{18}$ cm$^{-3}$.

With the above-mentioned structure, when AuGe/Ni is used as the n-type electrode 8, it is possible to obtain a satisfactory ohmic contact. However, a contact on the interface between the p-ZnSe contact layer and the p-type electrode 7 made of Au forms a Schottky contact and presents a non-ohmic property. Therefore, when the semiconductor is conducted, a fall in potential of about 10 V occurs so that the operation voltage of the semiconductor becomes as high as 10 V to 50 V, which becomes a problem which prevents the semiconductor from being continuously operated at room temperature.

To solve the aforesaid problem, there is proposed a method in which a p-ZnTe which can be contacted with metal, such as Au or the like in an ohmic contact is formed on the p-ZnSe or which uses a structure formed through p-ZnSe/p-ZnTe graded resonance quantum well (see our U.S. patent Ser. No. 08/078,037 which is incorporated herein by reference). The practical p-type electrode contact cannot be realized yet.

When on the other hand a p-type GaAs substrate is used, as shown in FIG. 2, on the substrate 1 made of p-GaAs or the like are grown a buffer layer 2 made of p-ZnSSe or the like, a p-type first cladding layer 3, an active layer 4, an n-type second cladding layer 5 and an n-type contact layer 6, in that order. Materials for these layers can be selected similarly when the respective layers are formed on the n-type GaAs substrate 1 shown in FIG. 1.

In this case, the substrate 1 made of p$^+$-GaAs or the like having p-type impurity of high concentration and the electrode 8 made of Ti/Pt/Au or AuZn/Au or the like are contacted in an ohmic contact fashion. Also, the n-side electrode, i.e., the Cl-doped n$^+$-ZnSe can achieve a carrier concentration of $10^{19}$ cm$^{-3}$ or greater. The Ti/Pt/Au electrode can obtain an ohmic contact as high as the practical level which is $1 \times 10^{-4} \Omega$cm$^2$ (see our Japanese laid-open patent publication No. 5-335267). Thus, the problem of contact with the electrode can be solved.

When an acceptor concentration of the substrate 1 is about $1 \times 10^{19}$ cm$^{-3}$ and an acceptor concentration of the ZnSe buffer layer 2 is about $1 \times 10^{18}$ cm$^{-3}$ on the interface between the p-GaAs substrate 1 and the p-ZnSe buffer layer 2 as shown by a solid line v in FIG. 3 which schematically shows the connected state of a valence band, a discontinuous amount of valence band of about 1 eV exists. Therefore, when a hole h passes the interface, a large fall of potential occurs so that the laser operation voltage becomes 10 V or greater (see H. Jeon et al. Applied Physics Letters vol. 59, p.3619 (1991)).

SUMMARY OF THE INVENTION

In view of the aforesaid aspects, an operation voltage of a II/VI-compound semiconductor laser can be reduced and a green or blue color semiconductor laser can be obtained. This semiconductor laser can continuously be operated at room temperature with a long life span.

According to the present invention, a p-type ZnSe or p-type ZnSSe buffer layer is formed on a p-type GaAs substrate a at least a single layer made of AlGaInP-based material and a II/VI-compound laser structure is then formed on the p-type ZnSe or p-type ZnSSe buffer layer.

Further, according to the present invention, an AlGaAs-based buffer layer is provided between the substrate and the AlGaInP-based buffer layer.

Further, according to the present invention, the AlGaInP-based buffer layer has a composition expressed as Al$_{0.5}$In$_{0.5}$P and the AlGaAs-based buffer layer has a composition expressed as Al$_{0.6}$Ga$_{0.4}$As.

Furthermore, according to the present invention, a composition ratio y of Al of a buffer layer expressed as (Al$_y$Ga$_{1-y}$)$_{0.5}$P is modulated from 0 to 1 and a composition ratio x of Al of a buffer layer expressed as Al$_x$Ga$_{1-x}$As is modulated from 0 to 0.6.

DETAILED DESCRIPTION OF THE PREFERRED EMBODIMENTS

The present invention will now be described in detail with reference to the drawings.

Figure 1:
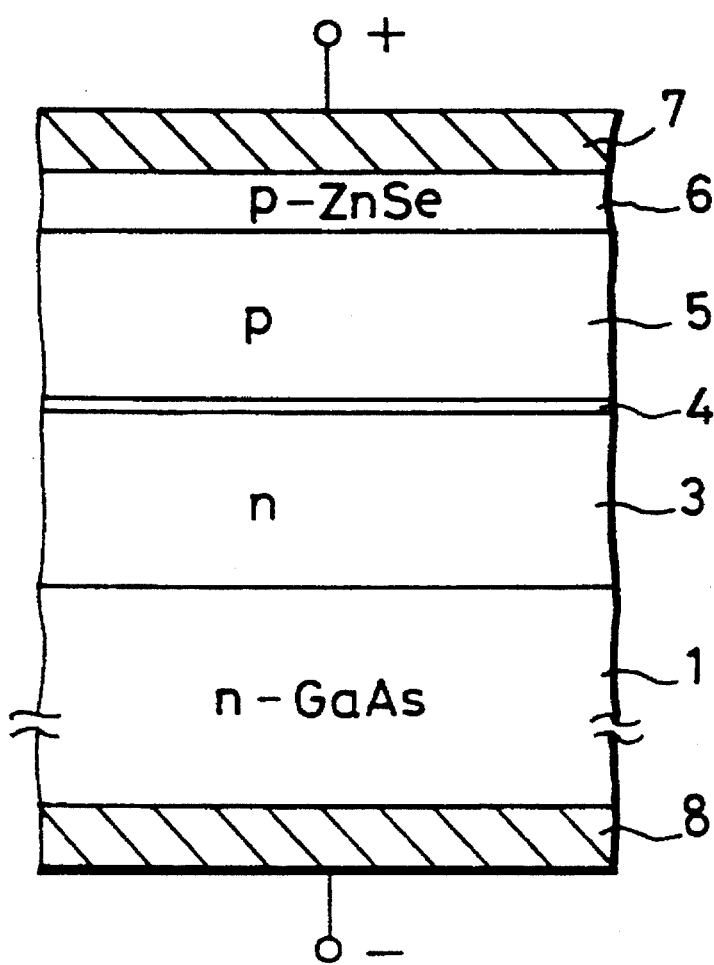
FIG. 1 is a schematic enlarged cross-sectional view showing an example of a semiconductor laser.
Figure 2:
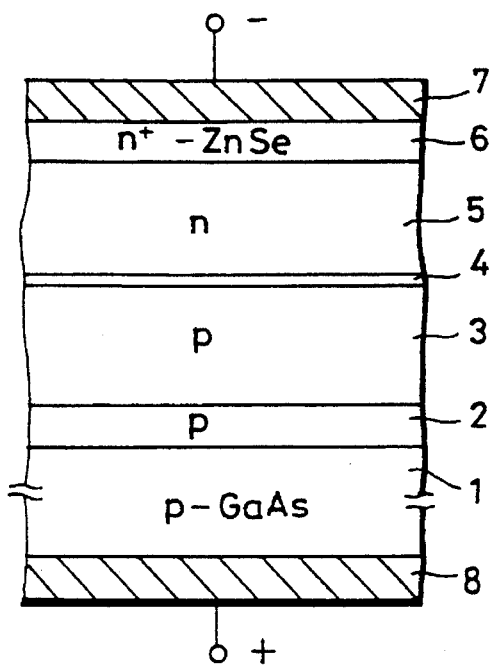
FIG. 2 is a schematic enlarged cross-sectional view showing another example of a semiconductor laser.
Figure 3:
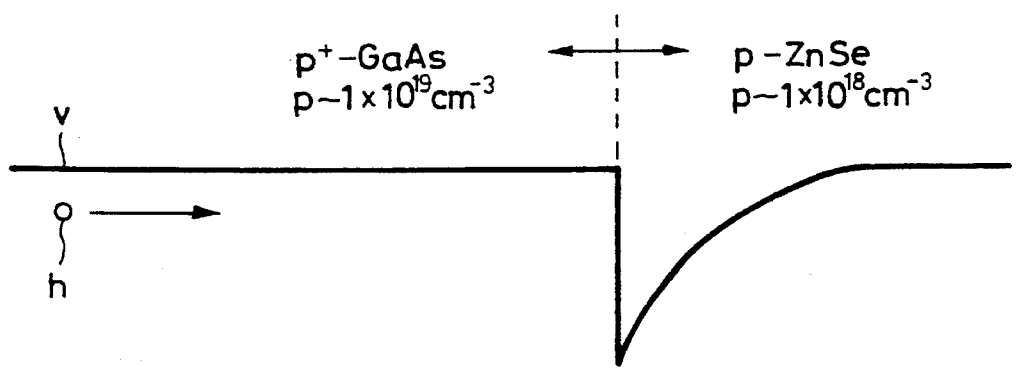
FIG. 3 is a diagram schematically showing the connected state of a valence band in the example of the semiconductor laser.
Figure 4:
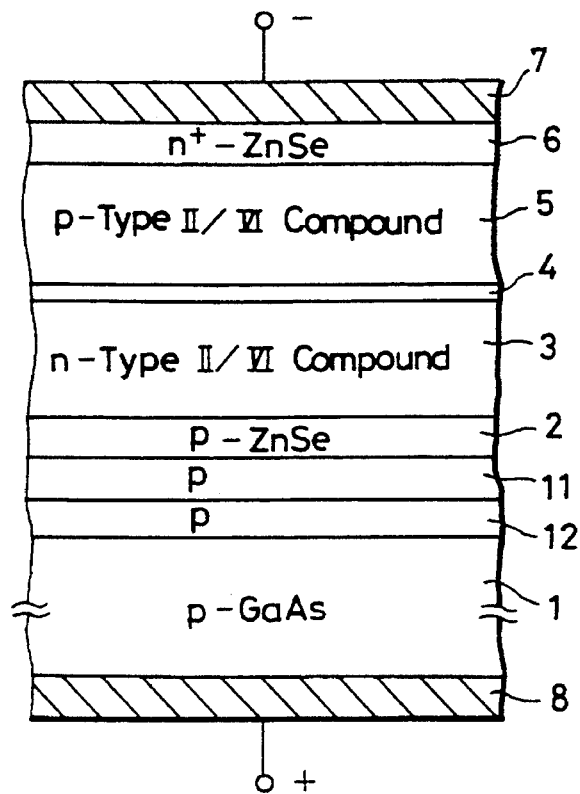
FIG. 4 is a schematic enlarged cross-sectional view showing a semiconductor laser according to a first embodiment of the present invention.

FIG. 4 is a schematic cross-sectional view showing a semiconductor laser according to a first embodiment of the present invention. In FIG. 4, like parts corresponding to those of FIG. 1 are marked with the same references.

As shown in FIG. 4, when the II/VI-compound semiconductor laser is formed by using the p-GaAs substrate 1, a discontinuous valence band existing on the interface between the substrate 1 and the buffer layer 2 made of p-type ZnSE or p-type ZnSSe can effectively be reduced by inserting buffer layers 11 and 12 made of p-AlGaInP-based compound and p-AlGaAs-based compound into the substrate 1 and the buffer layer 2, whereby the fall of potential that occurs when a hole passes the interface is suppressed effectively.

Figure 5:
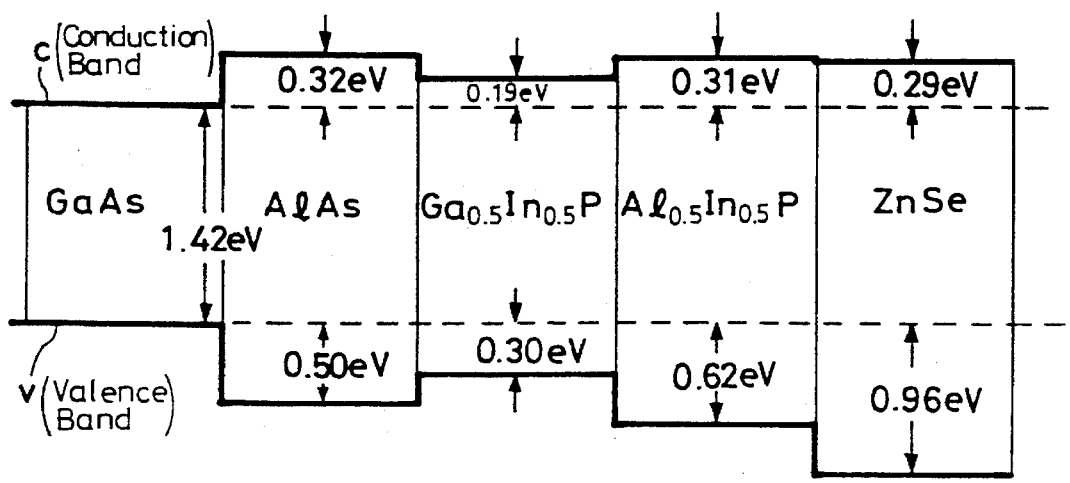
FIG. 5 is a diagram showing the relative relationship among valence bands and conduction bands of semiconductor compounds.

FIG. 5 shows a relative positional relationship among conduction bands and valence bands of III/V-compound semiconductor which is lattice-matched with GaAs and which can produce a high quality epitaxial layer, mixed crystal and ZnSe on the basis of GaAs. In FIG. 5, a solid line c represents the conduction band level and a solid line v represents the valence band level, respectively. A bandgap 1.42 eV of GaAs is taken as a reference level and the valence band level difference and conduction band level difference of AlAs, $Ga_{0.5}In_{0.5}P$, $Al_{0.5}In_{0.5}P$ and ZnSe are described in FIG. 5. An axamination of FIG. 5 reveals that, of the materials which are lattice-matched with GaAs and which can be crystallized with high quality, the work function of valence band of $Al_{0.5}In_{0.5}P$ is largest and closest to the valence band of ZnSe.

Maximum carrier concentrations $P_{max}$ that are obtained by adding p-type impurity to the above-mentioned respective compound semiconductors and valence band discontinuous amounts $\Delta E_v^o$ are illustrated on the following table 1. Other materials than p-ZnSe can be highly doped with a carrier concentration of $1\times10^{19}$ cm$^{-3}$.

TABLE 1

| item material | $P_{max}$ (cm$^{-3}$) | dopant (growing method) | $\Delta Ev^o$ (eV) |
| --- | --- | --- | --- |
| GaAs | $\sim 3 \times 10^{19}$ | Zn (HB, LEC, MOCVD) | — |
| $Al_{0.6}Ga_{0.4}As$ | $>1 \times 10^{19}$ | Zn (MOCVD), Be (MBE) | 0.30 |
| $Ga_{0.5}In_{0.5}P$ | $>1 \times 10^{19}$ | Zn (MOCVD), Be (MBE) | 0.30 |
| $Al_{0.5}In_{0.5}P$ | $>1 \times 10^{19}$ | Be (MBE) | 0.62 |
| ZnSe | $\sim 1 \times 10^{18}$ | N (MBE) | 0.96 |

When two materials whose hole concentrations are about $1\times10^{18}$ cm$^{-3}$ are connected, if the discontinuous amount of valence band of about 0.3 eV exists, a drop of potential occurred when the hole passes the interface that is substantially not a serious problem. When the discontinuous amount of valence band exceeds about 0.4 eV, the influence of potential barrier starts to become remarkable. In actual practice, in the AlGaInP-based red color semiconductor laser, a satisfactory conduction characteristic can be realized by inserting $p-Ga_{0.5}In_{0.5}P$ or $p-Al_xGa_{1-x}As$ (0.3<x<0.8) into an interface between a cladding layer made of $p-(Al_{0.5}Ga_{0.5})_{0.5}In_{0.5}$ and a potential barrier $\Delta E_v \div 0.46$ eV of a p-GsAs contact layer. Accordingly, it is to be understood that a practical conduction characteristic can be achieved on an interface ($\Delta E_v \div 0.34$ eV) between $p-Al_{0.5}In_{0.5}P$ and ZnSe whose hole concentrations are about $10^{18}$ cm$^{-3}$.

Therefore, according to the present invention, when the p-type substrate is used, the potential barrier on the interface between the GaAs substrate and the ZnSe or ZnSSe buffer layer can be alleviated to thereby prevent a large fall of potential from being caused when a hole passes the interface. Consequently, it is possible to obtain a green or blue color semiconductor laser of relatively low laser operation voltage. Thus, the resultant semiconductor laser can be operated continuously at room temperature with a long life span.

In the first embodiment of the present invention shown in FIG. 4, the first p-AlGaAs buffer layer 12 and the second p-AlGaInP buffer layer 11 are inserted from the substrate side on the p-GaAs substrate 1 and the p-ZnSe buffer layer 2, on which there are epitaxially grown the first cladding layer 3 made of p-type II/VI-compound, the active layer 4 made of intrinsic II/VI-compound, the second cladding layer 5 made of n-type II/VI-compound and the n-type contact layer 6, in that order, according to MOCVD or MBE. Then, the n-side electrode 7 is deposited on the n-type contact layer 6 and the p-side electrode 8 is deposited on the rear surface of the substrate 1, to thereby from a laser structure.

The first and second cladding layers 3 and 5 are made of ZnMgSSe, ZnSSe or a combination of ZnMgSSe, ZnSSe and a ZnSe optical guide layer. Cl or Ca or the like might be used as the n-type dopant and N or O or the like might be used as the p-type dopant. The active layer 4 is made of a single distortion quantum well of ZnSe, ZnCdSe or a multiplex distortion quantum well of ZnSe and ZnCdSe. Further, the n-type contact layer 6 might be made of Cl-doped $n^+$-ZnSe or $n^+$-$ZnS_zSe_{1-z}$ (z is about 0.06 which is lattice-matched with GaAs, for example). In this case, as described above, the carrier concentration of $10^{19}$ cm$^{-3}$ or greater can be achieved, and an ohmic contact of practical level in which a contact resistance is $1\times10^{-4}\Omega cm^2$ can be obtained by Ti/Pt/Au electrode, for example. Moreover, the substrate made of p+-GaAs or the like and the electrode 8 made of Ti/Pt/Au or AuZn/Au or the like can provide an ohmic contact.

In this embodiment, the $p-Al_xGa_{1-x}As$ buffer layer 12 and the buffer layer 11 made of p-AlGaInP-based $(Al_yGa_{1-y})_{0.5}In_{0.5}P$ are inserted from the substrate 1 side into the p-GaAs substrate 1 and the p-ZnSe buffer layer 2, in that order, as described above.

Figure 6:
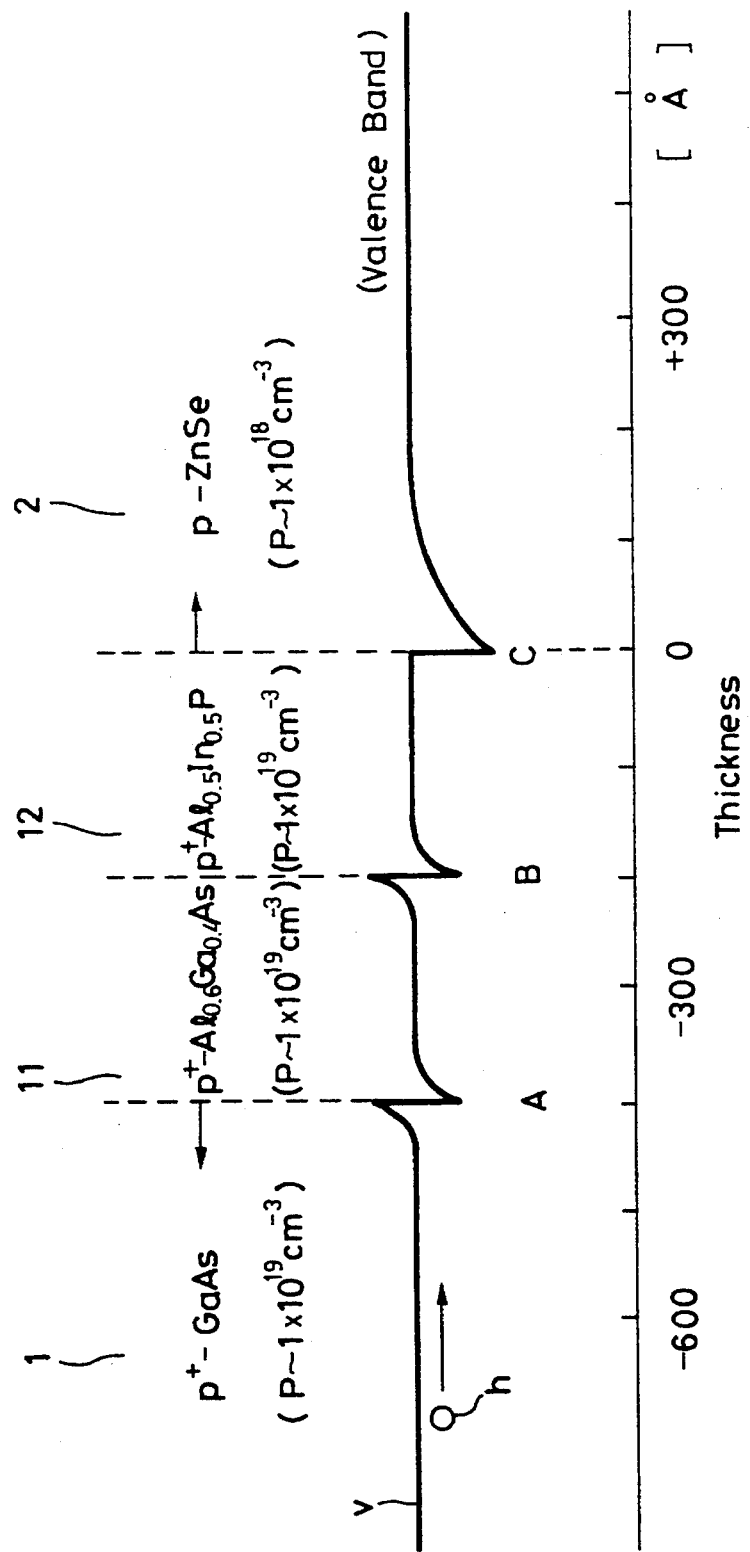
FIG. 6 is a diagram schematically showing the connected state of a valence band according to the first embodiment of the present invention.

FIG. 6 shows the connected state of valence bands obtained when $Al_{0.6}Ga_{0.4}As$ having a carrier concentration of about $1\times10^{19}$ cm$^{-3}$ is used as $p-Al_xGa_{1-x}As$ layer and a layer having a carrier concentration of $1\times10^{19}$ cm$^{-3}$ is used as the p-type $(Al_yGa_{1-y})_{0.5}In_{0.5}P$ layer. In FIG. 6, horizontal axes represent thicknesses of the respective layers and 0 assumes an interface position between the AlGaInP buffer layer and the ZnSe buffer layer.

The curved width W of valence bands in two interfaces A and B between the p-GaAs substrate 1 and the p-AlGaAs buffer layer 12 or the p-AlGaAs buffer layer 12 and the p-AlGaInP buffer layer 11 is expressed as:

$$W=((2\epsilon/qN_A)\cdot\phi\tau)^{1/2}$$

($\epsilon$: dielectric constant, q: electric charge, $N_A$: acceptor concentration, $\phi\tau$: height of barrier)

Therefore, the curved width W falls in a range of from 40 to 50 Å. In this case, $\phi\tau=\Delta E_v/2$ to 0.16 eV, $N_A\sim1\times10^{19}$ cm$^{-3}$ and $\epsilon\sim10\epsilon_O$ ($\epsilon_0$: dielectric constant in vacuum).

If the acceptor concentration of the p-type ZnSe buffer layer 2 is selected to be $N_A=1\times10^{18}$ cm$^{-3}$ on the interface C between the p-AlGaAs buffer layer 11 and the p-ZnSe buffer layer 2, then the potential barrier $\Delta E_v=0.34$ eV is established to assume a step junction so that a band curve of 180 Å is produced on the ZnSe buffer layer side, thereby the valence band connected state shown in FIG. 6 being presented. A band discontinuous state between the p-type GaAs substrate 1 and the p-type ZnSe buffer layer 2 is divided substantially by three by the inserted buffer layers. Then, the potential barrier of hole is considerably reduced to be less than 0.3 eV on each interface as compared with that of GaAs.

Although the thickness of each buffer layer naturally depends on the carrier concentration P, it is sufficient that, when the carrier concentration P is $1\times10^{18}$ vm$^{-3}$ or greater, the thickness might be 400 Å or greater at minimum.

A semiconductor laser according to another embodiment of the present invention will be described below with reference to FIGS. 7 to 12 which show the valence band connected states. In FIGS. 7 through 12, like parts corresponding to those of FIG. 6 are marked with the same references and therefore need not be described.

Figure 7:
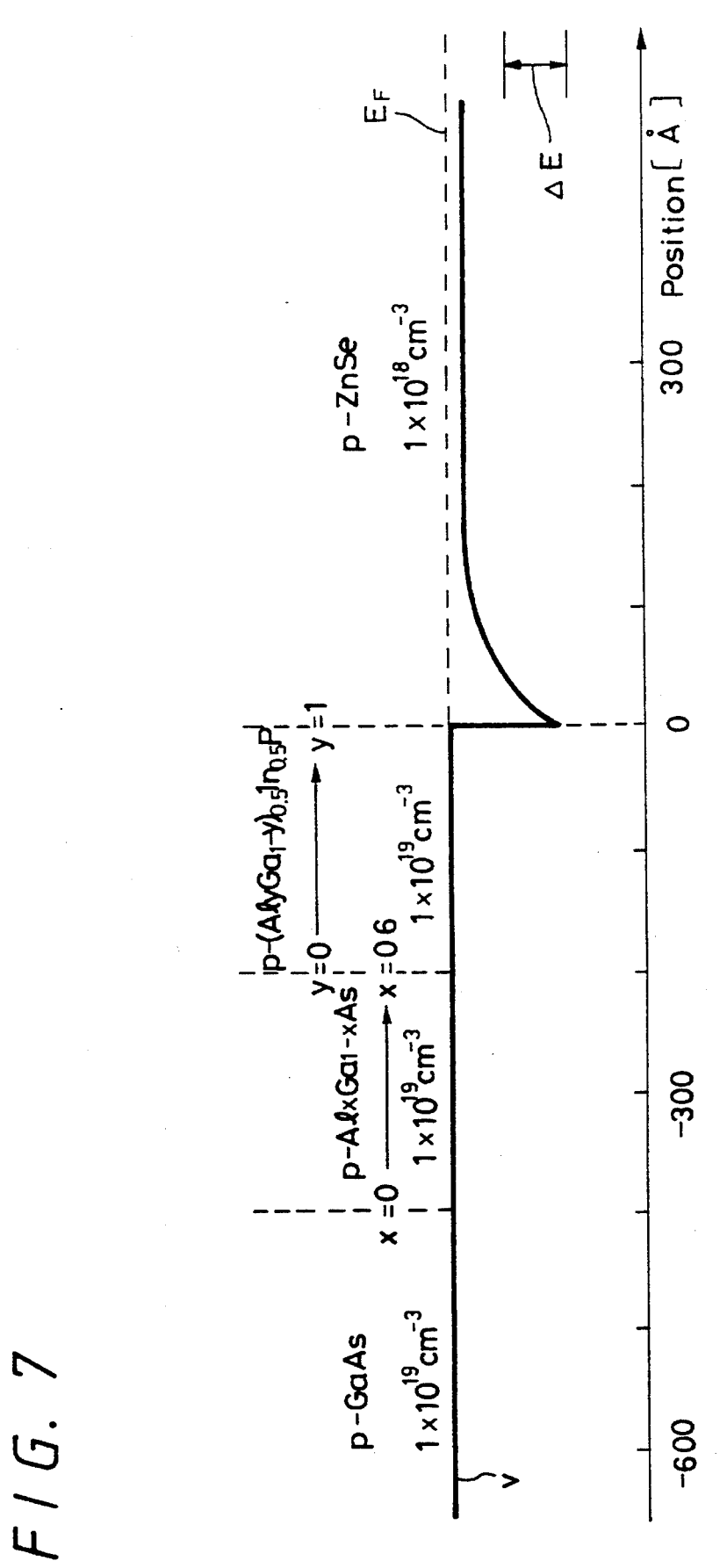
FIGS. 7 through 12 are diagrams schematically showing the connected state of valence bands according to a second embodiment of the present invention, respectively.

In the example shown in FIG. 7, the composition ratio y of Al in the buffer layer 11 expressed as $(Al_yGa_{1-y})_{0.5}In_{0.5}P$ is modulated in a range of y=0 to y=1 and the composition ratio x of Al in the buffer layer 12 expressed as $Al_xGa_{1-x}As$ is modulated in a range of x=0 to x=0.6 from the GaAs substrate 1 side.

If the compositions of the respective buffer layers 11 and 12 are changed with an inclination, then the areas having no potential barrier can be formed on the side of 1 corresponding to the buffer layers 12 and 11. In this case, this becomes particularly effective when the carrier concentration P is relatively as low as about $1\times10^{18}$ cm$^{-3}$.

Figure 8:
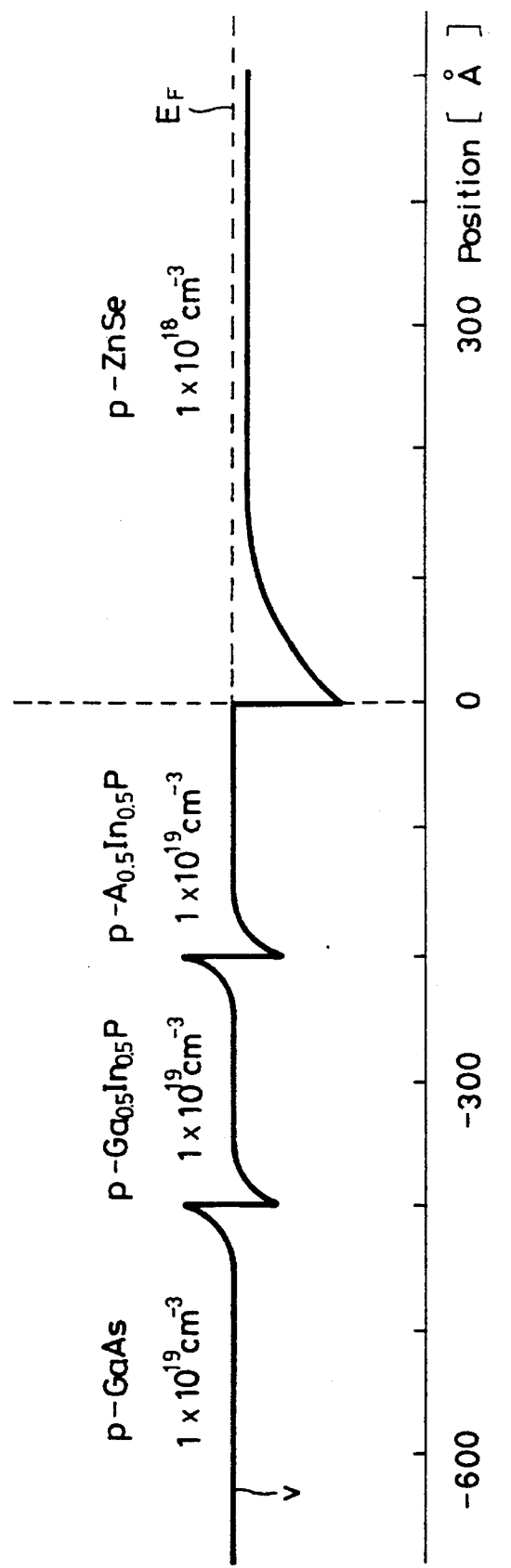

In the example shown in FIG. 8, as the material of the buffer layer 12 on the substrate 1 side is used p-$Ga_{0.5}In_{0.5}P$ instead of $Al_{0.5}Ga_{0.4}As$. Specifically, in this case, two buffer layers of y=0 and y=1 were formed in p-$(Al_yGa_{1-y})_{0.5}In_{0.5}P$. When the buffer layer is formed of only $(Al_yGa_{1-y})_{0.5}In_{0.5}P$ or the layer in which y is successively increased from 0 to 1 in this composition, the p-AlGaAs buffer layer need not always be provided and therefore the potential barrier of the hole can be reduced sufficiently.

Figure 9:
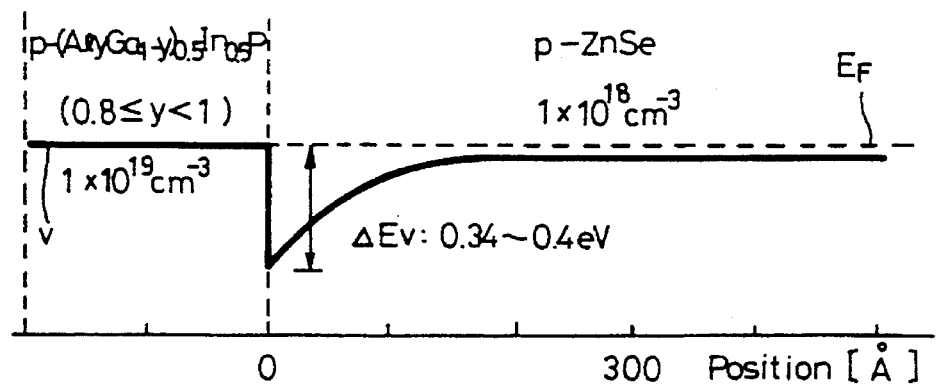

In the example shown in FIG. 9, in the structure shown in FIG. 8, the p-AlInP buffer layer 11 is replaced with a p-$(Al_yGa_{1-y})_{0.5}In_{0.5}P$ buffer layer 11 where $0.8\leq y<1$. With this structure, the valence band potential barrier $\Delta E_v$ between the buffer layer 11 and the buffer layer 2 falls in a range of about 0.34 eV$<\Delta E_v\leq$0.4 eV.

Figure 10:
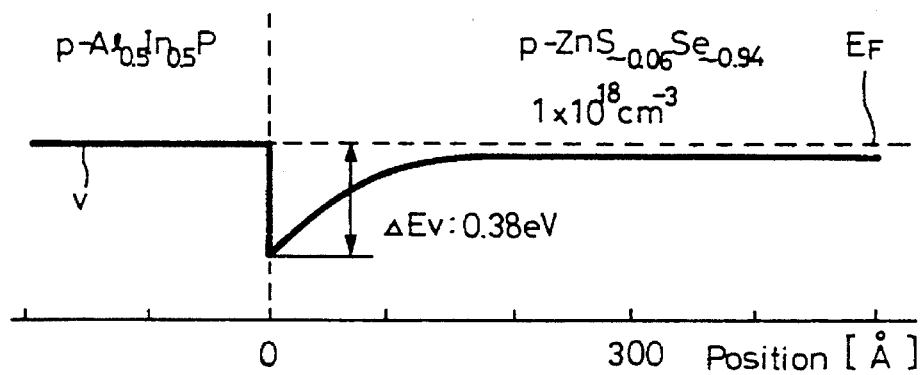

In the example shown in FIG. 10, the p-ZnSe buffer layer 2 is replaced with a mixed crystal of p-$ZnS_zSe_{1-z}$ (z is about 0.06 which is lattice-matched to the GaAs, for example). At that time, although the valence band potential barrier $\Delta E_v$ between the p-AlGaInP buffer layer and the p-ZnSSe buffer layer is increased by about 0.04 V as compared with that of the p-AlGaInP/p-ZnSe, it becomes possible to form a semiconductor laser whose operation voltage is sufficiently low.

Figure 11:
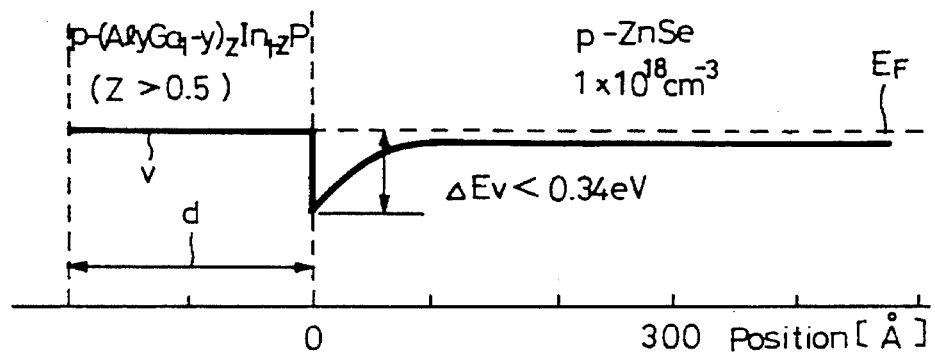

In the example shown in FIG. 11, the AlGaInP-based buffer layer is formed as p-$(Al_yGa_{1-y})_zIn_{1-z}P$ (z>0.5). If z>0.5 is established as described above, then a lattice matching with ZnSe is displaced and a range in which a buffer layer can be resiliently grown is changed with the increase of value z from 0.5. However, the bandgap becomes high so that the discontinuous amount of the valence band with the ZnSe buffer layer can be reduced. Therefore, by selecting the thickness d of the buffer layer to be such one that the buffer layer can be resiliently grown with the change of the composition ratio z, it is possible to obtain a semiconductor laser having a sufficiently satisfactory crystallinity and whose operation voltage is low.

The thickness d of the buffer layer can be obtained from Matthews's equation and People's equation ( see "Applied Physics" vol. 61, 2 "Design and manufacture of II/VI-semiconductor heterostructure (Ichino et al.)", p.123). In this case, a lattice mis-matching might be about 1% or smaller. When $Al_{0.5}In_{0.4}P$ is used, for example, the lattice mis-matching becomes about 0.7% and the film thickness d can be made about 20 nm.

Figure 12:
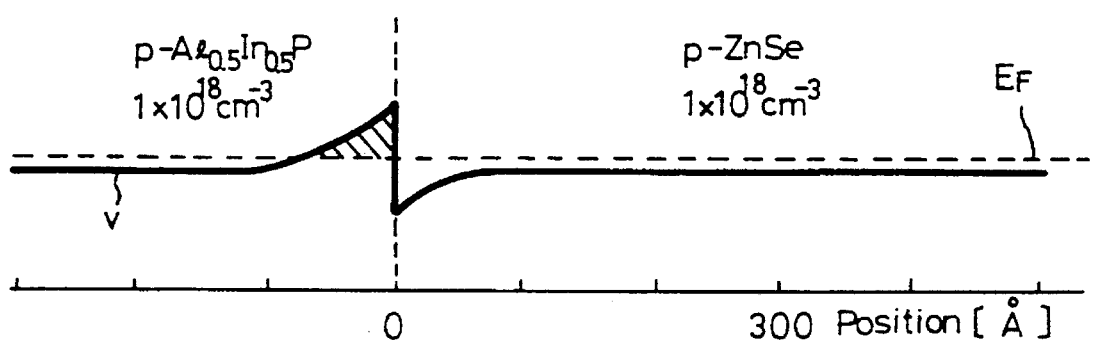

Furthermore, in the example shown in FIG. 12, if the carrier concentration P of the $(Al_yGa_{1-y})_{0.5}In_{0.5}P$ buffer layer (y is substantially greater than 0.8 and smaller than 1) is rather matched to $1\times10^{18}$ cm$^{-3}$ which is the same as that of p-ZnSe buffer layer near the interface between it and the p-ZnSe buffer layer, then the band curve near the interface is divided substantially equally to p-AlGaInP and p-ZnSe buffer layers. Therefore, the potential barrier produced on the interface between p-AlGaInP/p-ZnSe can be reduced by half to about 0.17 eV, thereby the conduction characteristic is improved much more.

As set forth, according to the present invention, when the semiconductor laser is formed by using the p-GaAs substrate, the discontinuous amount of valence band can effectively be alleviated by inserting the buffer layers into the p-GaAs substrate and the p-ZnSe buffer layer.

Consequently, it is possible to realize a diode which can exhibit an ideal I-V characteristic in which the diode can be actuated by a current of about 3 V corresponding to a built-in potential of the pn junction in the ZnSe. Therefore, a green or blue color semiconductor laser of low operation voltage can be obtained. This semiconductor laser can be operated continuously at room temperature and with a long life span.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor laser comprising:

a p-type GaAs substrate;

a first intermediate buffer layer of AlGaInP-based material;

a p-type buffer layer of ZnSSe or ZnSe formed on said AlGaInP first intermediate buffer layer; and a II/VI-compound laser structure formed on said p-type ZnSe or ZnSSe buffer layer.

2. The semiconductor laser according to claim 1, further comprising an AlGaAs-based second intermediate buffer layer provided between said GaAs substrate and said first intermediate buffer layer.

3. The semiconductor laser according to claim 2, wherein said AlGaAs-based buffer layer has a composition expressed as $Al_{0.6}Ga_{0.4}As$ and said AlGaInP-based buffer layer has a composition expressed as $(AlGa)_{0.5}IN_{0.5}P$.

4. The semiconductor laser according to claim 2, wherein a composition ratio x of Al in the second intermediate buffer layer is expressed as $Al_xGa_{1-x}As$ and is in a range from 0 to 0.6 and a composition ratio y of Al in the first intermediate buffer layer is expressed as $(Al_yGa_{1-y})_{0.5}In_{0.5}P$ and has a value between 0 and 1.

5. A semiconductor laser comprising:

a p-type GaAs substrate;

a p-type buffer layer of ZnSe or ZnSSe;

a first intermediate buffer layer of AlGaInP between the buffer layer and the substrate; and a second intermediate buffer layer of AlGaAs between the first intermediate buffer layer and the substrate.

6. The semiconductor laser of claim 5, wherein said AlGaAs-based buffer layer has a composition expressed as $Al_{0.6}Ga_{0.4}As$ and said AlGaInP-based buffer layer has a composition expressed as $(AlGa)_{0.5}In_{0.5}P$.

* * * * *